(12) United States Patent
Ong

(10) Patent No.: US 6,711,089 B2
(45) Date of Patent: Mar. 23, 2004

(54) METHOD AND APPARATUS FOR PERFORMING SIGNAL SYNCHRONIZATION

(75) Inventor: Hui-Sian Ong, West Wing (SG)

(73) Assignee: Agilent Technologies, Inc., Palo Alto, CA (US)

( * ) Notice: Subject to any disclaimer, the term of this patent is extended or adjusted under 35 U.S.C. 154(b) by 33 days.

(21) Appl. No.: 10/141,027
(22) Filed: May 8, 2002

(65) Prior Publication Data

US 2003/0210603 A1 Nov. 13, 2003

(51) Int. Cl.$^7$ ............................................. G11C 8/00
(52) U.S. Cl. ................................... 365/233; 365/189.05
(58) Field of Search ........................... 365/233, 189.01, 365/189.05

(56) References Cited

U.S. PATENT DOCUMENTS 5,256,912 A * 10/1993 Rios ........................... 327/144
5,418,407 A * 5/1995 Frenkil ........................ 327/163
5,652,733 A * 7/1997 Chen et al. ................... 365/233

* cited by examiner

Primary Examiner—Anh Phung

(57) ABSTRACT

A data synchronization cell is provided that comprises first and second synchronizers that are generally adjacent one another and that have their M1/S1 clock ports tied together. The result is that both synchronizers are driven by the same clock signal, which arrives substantially simultaneously at the M1/S1 clock ports of the synchronizers due to the fact that the synchronizers are side-by-side and their respective M1/S1 clock lines are tied together. Because the first and second synchronizers of the present invention are adjacent one another and have their respective M1/S1 clock lines tied together, clock skew is negligible and thus no buffer is needed between the synchronizers, which increases the amount of time allowed for resolution, reduces or eliminates the possibility of hold time violations occurring, and reduces the amount of area required to instantiate the synchronization cell.

7 Claims, 5 Drawing Sheets

METHOD AND APPARATUS FOR PERFORMING SIGNAL SYNCHRONIZATION

TECHNICAL FIELD OF THE INVENTION

The present invention is generally related to integrated circuits (ICs) and, more particularly, to synchronizing data across two clock domains.

BACKGROUND OF THE INVENTION

Data synchronizers are known and are used to synchronize data moving from one clock frequency domain to another clock frequency domain. For example, data synchronizers are known to synchronize data moving from a higher clock frequency domain to a lower clock frequency domain, and vice versa.

Generally, current synchronization of signals across two clock domains is accomplished using two synchronizers that are tied together in a back-to-back configuration with a buffer connected to the output of one synchronizer and to the input of the other synchronizer. In this configuration, the buffer prevents or lessens the number of hold time violations. The synchronizers may have a relatively large distance between them in the IC layout and/or may have their clocks tied to different trunks, which can result in a low clock skew tolerance. Also, the buffer located between the synchronizers and the metal routing that connects the buffer to the synchronizers both contribute to the overall delay in synchronizing data across clock domains and consume area on the IC. All of these factors tend to reduce the resolution time of the synchronizer logic (i.e., the amount of time allotted for the logic to resolve to a logic 1 or a logic 0), which limits the performance of the IC.

When generating the IC layout with a tool, for example, the two associated synchronizers may be placed by the tool at any location in the IC layout. Thus, there may be a great distance between the synchronizers, regardless of whether they are placed in the same block of combinational logic or in different blocks. Of course, the greater the distance between the synchronizers, the greater the delay in synchronization. Also, because the synchronizers each may utilize a different clock trunk or route, the distance between the synchronizers will typically decrease the clock skew tolerance. Even if the synchronizers are placed in the same block, the utilization of separate clock trunks or routes for each synchronizer can reduce the clock skew tolerance. Also, even though the synchronizers may be placed very close together, it is difficult to ensure that the clock skew will be small enough to enable the buffer to be eliminated.

Accordingly, a need exists for a method and apparatus for data synchronization that minimizes the significance of clock skew tolerance margins such that the possibility that a metastable state will occur is minimized, the amount of time allowed for resolution is increased, and the need for a buffer between the synchronizers and the associated metal routing needed to connect the buffers to the synchronizers is eliminated.

SUMMARY OF THE INVENTION

The present invention provides a data synchronization cell that comprises at least a first and second synchronizer that are generally adjacent one another in side-by-side configuration and that have their respective M1/S1 clock ports tied together. The result of this configuration is that the synchronizers are driven by the same clock signal, and the clock signal arrives substantially simultaneously at the M1/S1 clock ports of the synchronizers due to the fact that the synchronizers are side-by-side. This eliminates clock skew or makes it negligible, which allows the buffer to be removed, which, in turn, allows more time for resolution.

In known synchronization cells, a buffer is placed between the data output port of the first synchronizer and the data input port of the second synchronizer to solve clock skew problems and to prevent hold time violations. In such systems, the synchronizers are referred to as being in a back-to-back configuration. The synchronizers may have great distances between them and/or receive their clock signals from different trunks. All of these features of the known synchronizer configurations decrease the amount of time allowed for resolution and increase the amount of area required to instantiate synchronization cells.

Because the synchronizers of the present invention are adjacent one another and have their respective M1/S1 clock lines tied together, clock skew is negligible and thus no buffer is needed between the synchronizers, which increases the amount of time allowed for resolution, reduces or eliminates the possibility of hold time violations occurring, and reduces the amount of area required to instantiate the synchronization cell.

These and other features and advantages will become apparent from the following description, drawings and claims.

DETAILED DESCRIPTION OF THE PREFERRED EMBODIMENTS OF THE INVENTION

Figure 1:
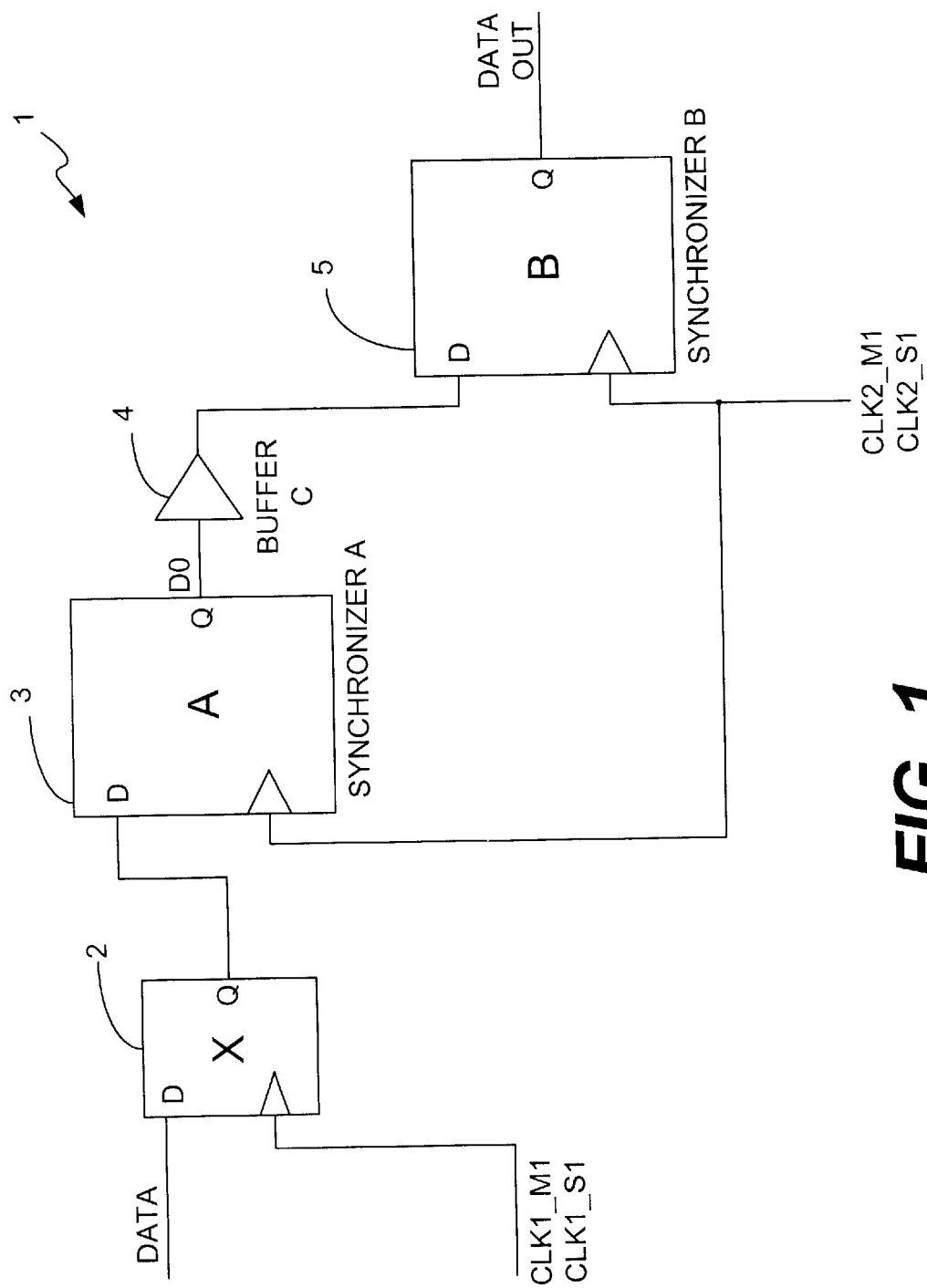
FIG. 1 is a block diagram of a typical data synchronizer layout in which two synchronizers are connected back-to-back and have a buffer in between them that is used to prevent hold time violations.
Figure 2:
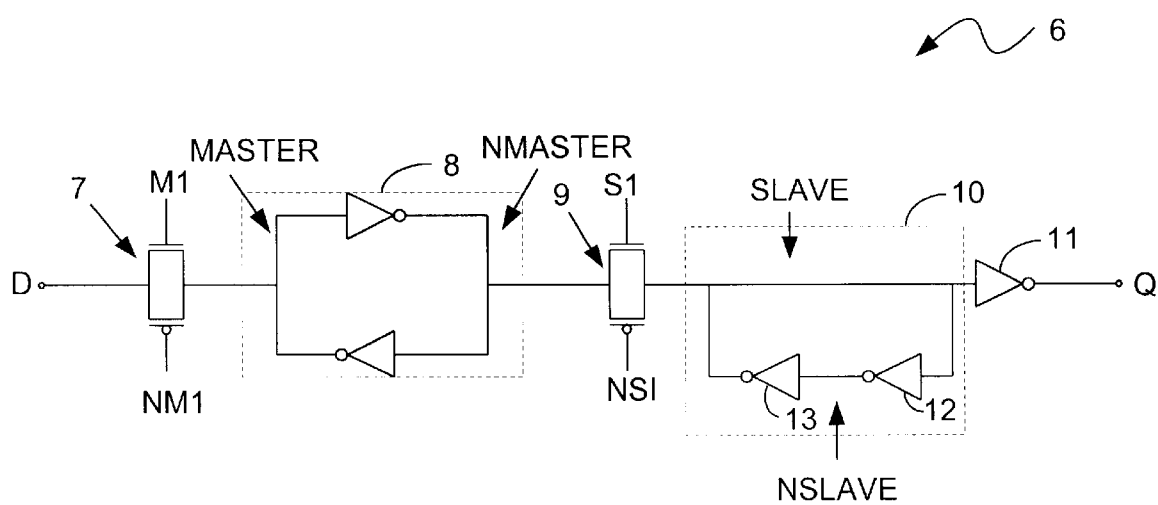
FIG. 2 is a schematic diagram of a typical master/slave flip-flop configuration.

FIG. 1 is a block diagram of a known synchronization circuit 1 for transferring data from one clock domain to another. A synchronizer typically comprises a plurality of flip-flops. Each flip-flop comprises a master/slave configuration wherein the master circuit is clocked by a clock signal typically referred to as M1 and the slave circuit, which receives the output of the master circuit, is clocked at the same clock rate, but with the inverted clock signal, which is referred to as S1. This type of master/slave configuration is well known in the art. An example of a typical flip-flop 6 is shown in FIG. 2. The flip-flop 6 comprises the M1 timing circuit 7, which comprises an n field effect transistor (nFET) and a pFET that are tied in parallel with each other. When M1 is a logic 1, the inverse of M1, NM1, is a logic 0. Because the nFET of circuit 7 is on when M1 is a logic 1 and the pFET is on when NM1 is a logic 0, the inverse of whatever is on the data input D is stored in the master latch. S1 is always the inverse of M1, and they are both derived from the clock. Therefore, when M1 goes low, S1 of the S1 timing circuit 9 goes high (NS1 goes low), and the data value held in the master circuit 8 is stored in the slave latch of the slave circuit 10. The value stored in the slave latch is received at the input of the inverter 11, which drives the Q output of the flip-flop. The value stored in the slave latch of circuit 10 is inverted by the inverter 11 such that the Q output of the flip-flop 6 has the same logic value as the D input of the flip-flop 6. The inverter 12 inverts the signal stored in the slave latch and the inverter 13 re-inverts that value. This ensures that the output Q of the flip-flop 6 will continue to be driven by the inverter 11 at the proper logic level until a different data value is stored in the slave circuit 10.

Figure 3:
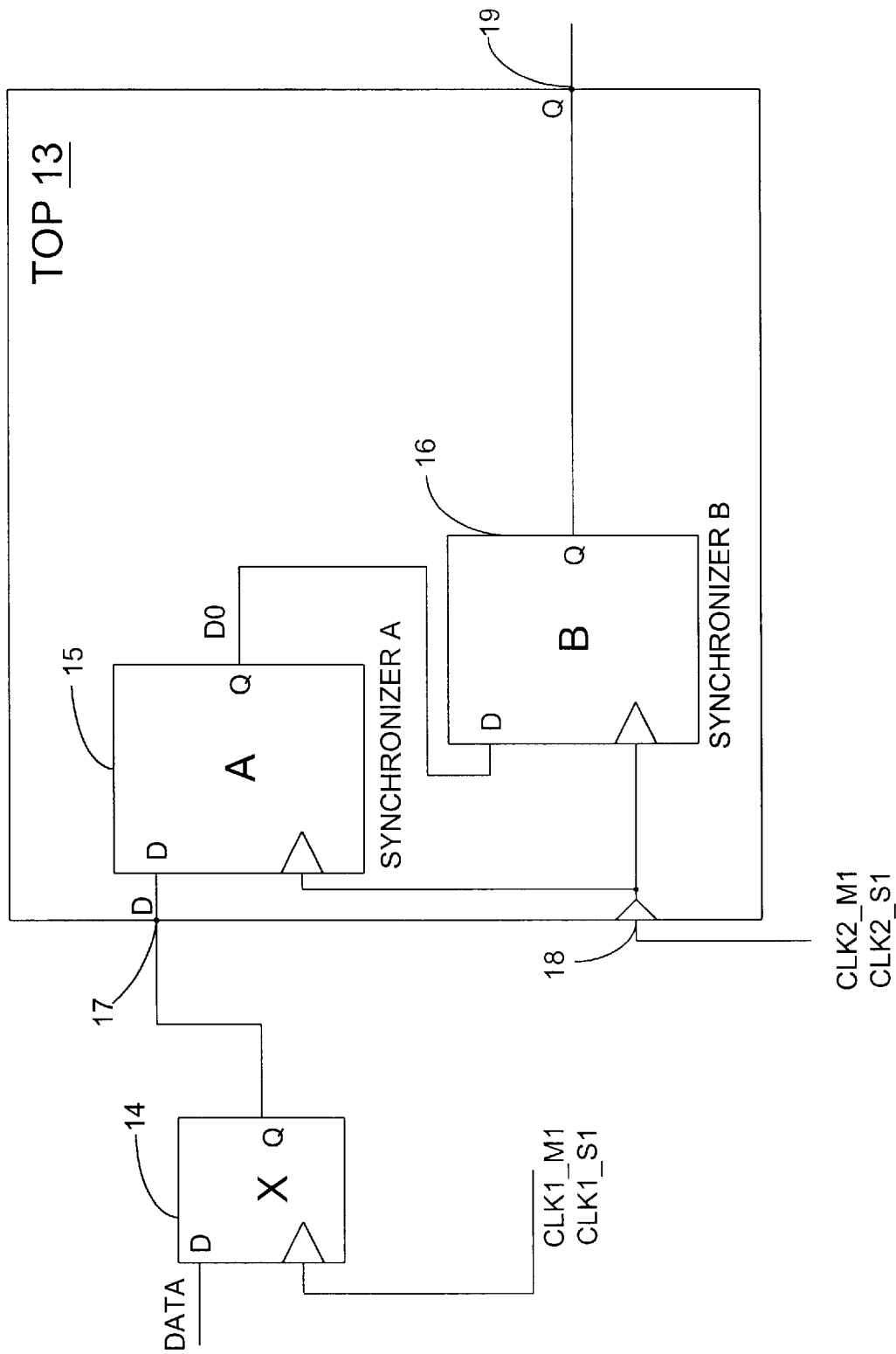
FIG. 3 is a block diagram of an example embodiment of two data synchronizers connected in a particular manner in accordance with the present invention such that clock skew is negligible, a buffer is not required to prevent hold time violations, and a single clock is used for both synchronizers.

Although there are many different types of flip-flop configurations, the synchronizers shown in FIGS. 1 and 3 can be conceptualized as comprising a plurality of flip-flops, each having a configuration similar or identical to the configuration shown in FIG. 2. However, those skilled in the art will understand that the present invention is not limited to any particular design for the flip-flops used in the synchronizers of the present invention. Also, latches, as opposed to flip-flops, could also be used in the synchronizers of the present invention.

With reference again to the known configuration of FIG. 1, a D flip-flop X labeled with numeral 2 is operating in the first clock domain CLK1. The synchronizer 2 samples data at its D input and the data signal is held until the signals CLK1_M1 and CLK1_S1 are received with the logic values that cause the data signal to be output from the flip-flop X. Thus, data is output from the flip-flop X at the first clock rate CLK1. When the data is clocked out of flip-flop X in the first clock domain, synchronizer A, labeled with numeral 3, samples the data signal. The sampled data signal is then clocked through the flip-flops (not shown) of synchronizer A at the clock rate of the second clock domain CLK2 in accordance with the CLK2_M1 and CLK2_S1 clock signals and is clocked out of synchronizer A at the rate of the second clock, CLK2. The data signal D0 clocked out of synchronizer A is received by the buffer C, labeled with numeral 4, which delays the data signal by a certain amount. The data signal D0 will arrive at the input D of synchronizer B, labeled with numeral 5, after a time period equal to the delay of the buffer C plus the wire delay associated with the length of the conductor from the output of synchronizer A to buffer C and from buffer C to the input of synchronizer B.

As stated above, the buffer C of the known configuration is used to prevent a hold time violation between the two synchronizers. In other words, the buffer C is used to prevent the signal D0 from arriving at the input of synchronizer B too early. Even though synchronizers A and B are clocked at the same clock rate CLK2, potential differences between the distances that CLK2 must travel to reach synchronizer A and synchronizer B can result in a low enough skew margin to cause a hold time violation to occur between the synchronizers. Thus, the buffers generally are always included in the IC layout.

As stated above, the present invention eliminates the need for placing a buffer in between synchronizers and eliminates the need to consider whether skew margin might cause a problem. An example embodiment of the present invention is shown in FIG. 3. In accordance with the present invention, the two (or more) synchronizers are placed generally side-by-side in a cell that can be incorporated into a netlist by a single instantiation. The S1 clock line of synchronizer A is tied to the S1 clock line of synchronizer B, and the M1 clock line of synchronizer A is tied to the M1 clock line of synchronizer B. By tying the clock lines of the two synchronizers together and by placing them in a cell side-by-side adjacent one another, there is no possibility of a hold time violation occurring because clock skew is prevented (or is negligible). Therefore, clock skew tolerance is not a consideration that needs to be taken into account. Consequently, the buffer of the known configuration shown in FIG. 1 is not needed, which, in turn, allows more resolution time and enhances the performance of the IC. The resolution time is given by the equation:

$$T_{res} = T_{CK} - T_{setup} - T_{delay},$$

where $T_{res}$ is the resolution time, $T_{CK}$ is the capturing clock period, $T_{delay}$ is the delay between the two synchronizers and $T_{setup}$ is the setup time. In accordance with the present invention, by removing the buffer, the amount of time for resolution is maximized.

The operations of the flip-flop X and of synchronizers A and B of the present invention shown in FIG. 3 are generally identical to the operations of the flip-flop X and of synchronizers A and B of FIG. 1. Therefore, the manner in which the flip-flop 14 and the synchronizers A and B, labeled with numerals 15 and 16, operate will not be discussed. However, as stated above, the synchronizers A and B of FIG. 3 are placed side-by-side adjacent one another, and the respective M1 clock lines and S1 clock lines of the synchronizers A and B are tied together. This obviates the need for the buffer C shown in FIG. 1. The cell configuration of the side-by-side synchronizers in accordance with the present invention will be referred to herein as "TOP", labeled with the numeral 13 in FIG. 3. The cell, "TOP", has port D 17, port Q 19 and the clock port 18. Port D of "TOP" is tied to port D of synchronizer A 15. Port Q of "TOP" is tied to port Q of synchronizer B 16. Port 18 is tied to the clock port of synchronizer A and to the clock port of synchronizer B. The Q port of synchronizer A 15 is tied to the D port of synchronizer B 16.

With respect to the known configuration of FIG. 1, the gate level netlist, which is usually Verilog based, contains synchronizer cells that are tied back-to-back with a buffer in between them, as shown. This gate level netlist is the source for the placement processes of cells in the IC layout (i.e., the layout is created from the netlist). In essence, the code for the netlist is written in a particular language, such as Verilog, for example. A synthesis program converts the code into gate level netlist. In accordance with the present invention, a program is written that identifies the synchronizer cells of the type shown in FIG. 1 (i.e., tied back-to-back) and replaces them with the new "TOP" cell 13 of the present invention shown in FIG. 3. This ensures that the layout created from the netlist places the "TOP" cells of the present invention wherever synchronization from one clock domain to another is needed, thereby maximizing resolution speed, avoiding synchronization-caused metastable states (by making clock skew negligible), and conserving room in the IC layout (by eliminating the buffer).

Figure 4:
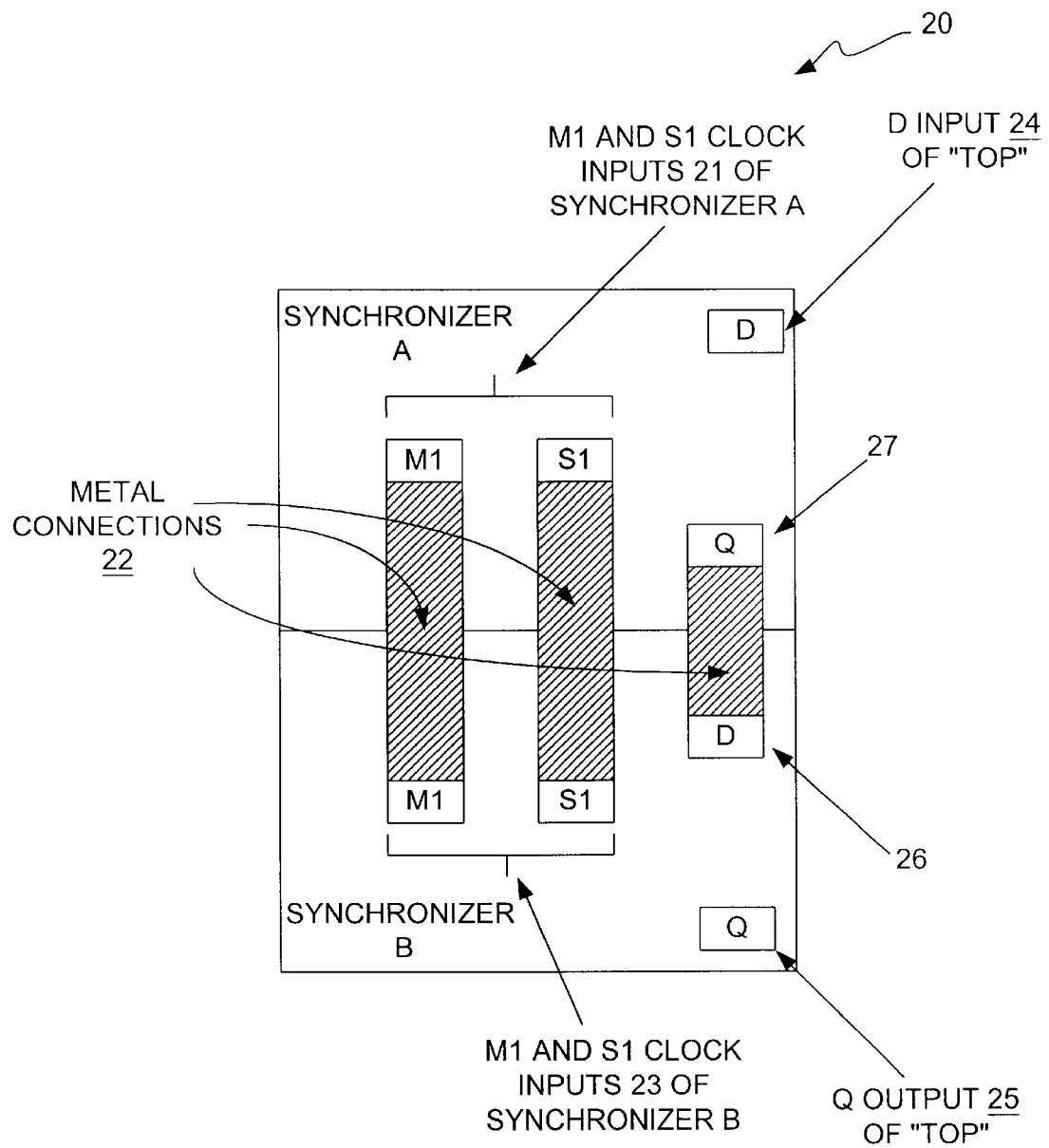
FIG. 4 is a diagram illustrating the preferred layout of the configuration of two synchronizers in accordance with an example embodiment of the present invention, wherein the two synchronizers behave as a cell top such that the configuration can be instantiated in the layout as a single instantiation, as opposed to two separate instantiations as required by the prior art layouts.

FIG. 4 illustrates the layout of the synchronization cell 20 of the present invention in accordance with an example embodiment of the present invention. It can be seen that the M1 and S1 clock inputs of synchronizer A, which are collectively represented by numeral 21, are tied by metal connections 22 to the M1 and S1 clock inputs, respectively, of synchronizer B, which are collectively represented by numeral 23. The Q port of synchronizer A is connected by a metal connection 22 to the D port of synchronizer B. The D input port of the cell 20, which is connected to the D input port of synchronizer A, is represented by the block 24. The Q output port of the cell 20, which is connected to the Q output of synchronize B, is represented by block 25. Thus, the adjacent synchronizers are connected as shown in a cell 20 that has a D input port, and M1/S1 clock port and a Q output port.

Figure 5:
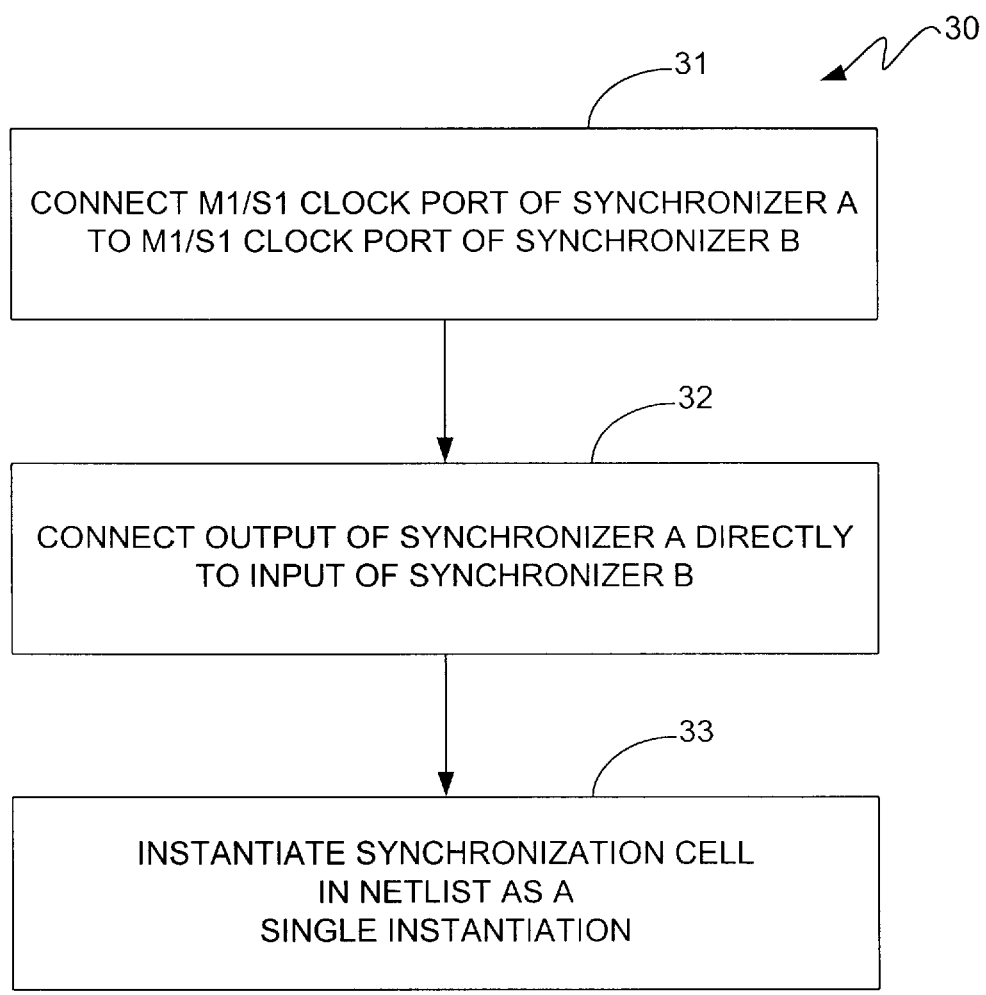
FIG. 5 is a flow chart illustrating an example embodiment of the method of the present invention.

FIG. 5 is a flow chart illustrating the method 30 of the present invention. It should be noted that the steps shown in FIG. 5 do not need to be performed in any particular order. The first step shown is to connect the M1/S1 clock port of synchronizer A to the M1/S1 clock port of synchronizer B, as indicated by block 31. Both of the clock ports are connected to the clock line. The output port of synchronizer A is connected to the input port of synchronizer B, as indicated by block 32. The synchronization cell is instantiated in the netlist, as indicated by block 33. As stated above, a program is written that will take the netlist and replace each synchronization cell in the netlist that includes a buffer with the synchronization cell of the present invention.

Figure 6:
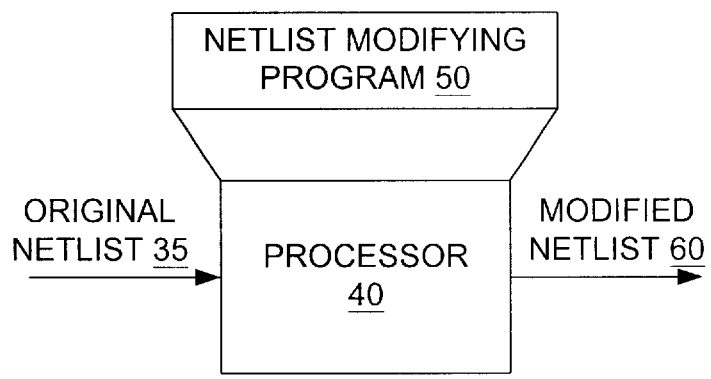
FIG. 6 is a block diagram of the apparatus of the present invention in accordance with the preferred embodiment.

FIG. 6 is a block diagram of the apparatus of the present invention, which comprises a processor 40 configured to execute a netlist modifying program 50. The processor 40 receives as its input the original netlist 35, which comprises at least one of the synchronization cells shown in FIG. 1. The program 50 traverses the original netlist 35, identifies the synchronization cells in the original netlist 35, and replaces the identified cells with the synchronization cells of the present invention to produce a modified netlist 60.

It should be noted that the present invention has been described with reference to particular embodiments. However, as will be understood by persons skilled in the art in view of the discussion provided herein, the present invention is not limited to the particular embodiments described herein. For example, although the present invention has been described with reference to two synchronizers, any number of synchronizers can be placed adjacent one another in the manner described above to eliminate or minimize clock skew and the need for a buffer. Also, the manner in which the flip-flops are designed and the flip-flop configurations are not limited to any particular designs or configurations. Also, as stated above, latches rather than flip-flops could be used in the synchronizers. The present invention is equally applicable to synchronizers designed with latches. Those skilled in the art will understand, in view of the description provided herein, that modifications may be made to the embodiments described herein that are within the scope of the present invention.

What is claimed is:

1. A synchronization cell comprising:

a first synchronizer, the first synchronizer having a data input port, D1, and a data output port, Q1, the first synchronizer receiving data at said data input port at a first clock rate corresponding to a first clock, the first synchronizer having a clock port for receiving a clock signal; and a second synchronizer, the second synchronizer having a data input port, D2, and a data output port, Q2, the data input port D2 of the second synchronizer being directly connected to the data output port Q1 of the first synchronizer, the second synchronizer having a clock port for receiving a clock signal, the first and second synchronizers being generally adjacent one another, the synchronizers each receiving a second clock signal at their respective clock ports over respective clock lines, the clock lines being tied together, the second clock signal having logic levels that control the propagation of data through the synchronizers, wherein data received at the data input port of the second synchronizer from the data output port of the first synchronizer is output from the data output port of the second synchronizer at a second clock rate that corresponds to the second clock, the second clock rate being different from the first clock rate.

2. The synchronization cell of claim 1, wherein the first and second synchronizers receive the second clock signal at the respective clock ports of the synchronizers substantially simultaneously.

3. The synchronization cell of claim 1, wherein each of the first and second synchronizers comprises a plurality of flip-flops.

4. The synchronization cell of claim 1, wherein each of the first and second synchronizers comprises a plurality of latches.

5. An apparatus for generating a modified netlist that includes at least one of the synchronization cells of claim 1 from an original netlist, the apparatus comprising:

first logic, the first logic receiving an original netlist that includes at least third and fourth synchronizers, the third and fourth synchronizers being connected in a back-to-back configuration with a buffer between the third and fourth synchronizers, the third synchronizer having a data input port, D3, and a data output port, Q3, the third synchronizer receiving data at said data input port at said first clock rate corresponding to said first clock, the third synchronizer having a clock port for receiving said second clock signal, the fourth synchronizer having a data input port, D4, and a data output port, Q4, the data input port D4 of the fourth synchronizer being connected to an output of the buffer, the data output port Q3 of the third synchronizer being connected to an input of the buffer; and second logic for generating said modifyied netlist, the second logic replacing said third and fourth synchronizers and said buffer in the original netlist with said synchronization cell to generate said modified netlist.

6. The apparatus of claim 5, wherein the first logic corresponds to a computer executing a software synthesis program that enables said original netlist to be generated.

7. The apparatus of claim 5, wherein the second logic corresponds to a computer executing a software program that enables said original netlist to be modified to generate said modified netlist.

* * * * *